Jan. 24, 1967 G. B. PRICE 3,300,733
RELAXATION OSCILLATOR MODULATED BY ANOTHER RELAXATION OSCILLATOR
Filed Dec. 16, 1964
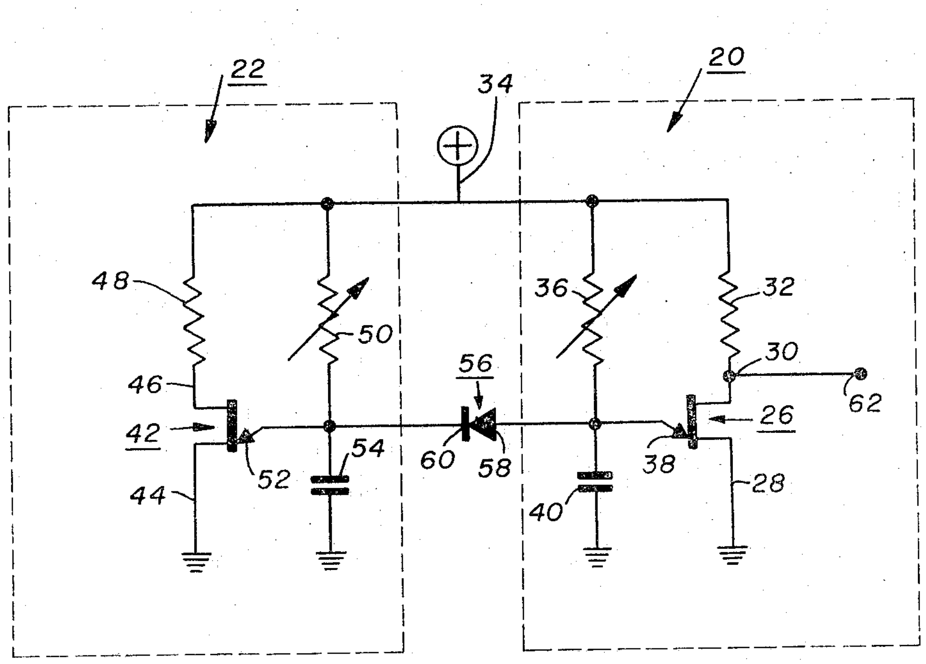
INVENTOR.
GEORGE B. PRICE
BY Kelly O. Corley
ATTORNEY United States Patent Office 3,300,733
Patented Jan. 24, 1967

3,300,733
RELAXATION OSCILLATOR MODULATED BY ANOTHER RELAXATION OSCILLATOR
George B. Price, Pensacola, Fla., assignor to Monsanto Company, a corporation of Delaware
Filed Dec. 16, 1964, Ser. No. 418,675
2 Claims. (Cl. 331—47)

This invention concerns an oscillator or signal generator having a basic output signal of a given frequency or repetition rate, which basic signal is modulated or periodically interrupted at a lower repetition rate. More particularly, the invention concerns a circuit including a first relaxation oscillator producing output pulses at a high repetition rate, which first relaxation oscillator is periodically interrupted or disabled by a second relaxation oscillator having output pulses occurring at a low repetition rate.

Prior art modulated tone oscillators were typically complicated and difficult to adjust to the desired operating conditions. The oscillator according to the present invention is simple and reliable in operation, and may readily be adjusted to the desired operation conditions. The preferred oscillator according to the present invention uses conventional unijunction transistor relaxation oscillator circuits so interconnected that one oscillator periodically disables or interrupts operation of the other oscillator.

For a more complete understanding of the nature and objects of the invention, reference should be had to the following detailed description taken in connection with the accompanying drawing, in which the figure is a schematic circuit diagram of the preferred embodiment of the invention.

As illustrated in the drawing, the oscillator according to the present invention includes first and second unijunction transistor relaxation oscillators 20 and 22 coupled by an impedance illustrated as a diode 56. Oscillator 20 includes unijunction transistor 26 having base-one electrode 28 and base-two electrode 30 connected in series with its interbase path and the load resistor 32 between positive power supply terminal 34 and a point of reference potential. A timing resistor 36 is connected between power supply terminal 34 and emitter electrode 38, while timing capacitor 40 is connected between emitter 38 and the point of reference potential.

Similarly, oscillator 22 includes unijunction transistor 42 having base-one electrode 44 and base-two electrode 46 connected in series with the interbase path and load resistor 48 between power supply terminal 34 and the point of reference potential. A timing resistor 50 is connected between power supply terminal 34 and emitter electrode 52, while timing capacitor 54 is connected between emitter 52 and the point of reference potential.

In themselves, oscillators 20 and 22 are entirely conventional in structure, and will be readily understood by those skilled in the art. According to the present invention, these oscillators are coupled together to provide a unique mode of operation by an impedance illustrated as coupling diode 56, which has its anode electrode 58 connected to emitter 38 and its cathode electrode 60 connected to emitter 52. The component values of timing resistor 36 and timing capacitor 40 in oscillator 20 are selected to provide a relatively high repetition rate of output pulses, for example, a few hundred or a few thousand repetitions per second. The values of timing resistor 50 and timing capacitor 54 are selected to provide a considerably lower repetition rate for oscillator 22, such as one pulse per second.

It may be seen that emitter 38 cannot be more positive than emitter 52 by an amount greater than the small forward voltage drop across diode 56. The potential on emitter 38 is thus prevented from rising to a level sufficient to trigger transistor 26 into conduction when transistor 42 conducts, and for some further period after transistor 42 ceases conduction. This further period extends until the potential on emitter 52 rises to a value sufficiently positive to permit transistor 26 to again be triggered, and is therefore determined by the rate at which capacitor 54 is recharged. For a given supply potential on conductor 34, this further period is therefore determined by the impedance values of resistors 36 and 50 and of capacitors 40 and 54, as well as the forward resistance of diode 56 and the triggering potential of emitter 38.

The following component values exemplify one embodiment of the invention, when using a 12 volt power supply:

| | |
|---|---|
| Transistor **26** | G.E. type 2N1671A |
| Transistor **42** | G.E. type 2N1571A |
| Diode **56** | 1N34 |
| Resistor **32** | 330 ohms |
| Resistor **36** | 1000 ohms |
| Capacitor **40** | 0.33 microfarad |
| Resistor **48** | 390 ohms |
| Resistor **50** | 47 kilohms |
| Capacitor **54** | 50 microfarad |

The selection of different component values for various particular applications is well within the scope of one skilled in the art.

When using a diode as the coupling impedance 56, oscillator 20 will be substantially unaffected by oscillator 22 whenever the diode is non-conductive, and will be disabled when the diode is conductive. Various other interactions between oscillators 20 and 22 may be achieved by replacing the diode with other types of impedances, such as with a capacitor, an inductor, or a resistor, or by networks combining these simple impedances. The particular type of output signal desired will determine the coupling impedance selection.

Although the particular circuit illustrated has no base-two resistors connected between the respective base-two electrodes and ground, such resistors can be added to either or both oscillators, if desired. If a base-two resistor is used in oscillator 20, the output signal may be taken at the base-two electrode 28; in any event the output signal may be derived from emitter 38. Either or both of resistors 36 and 50 may be variable, either manually or automatically in response to some condition, such as heat, light, et cetera.

It may be seen from the above description that the signal generator according to the present invention is adapted for use in a variety of practical applications. The circuit is simple, and permits considerable flexibility in selection of component values.

It will thus be seen that the objects set forth above, among those made apparent from the preceding description, are efficiently attained and, since certain changes may be made in the above article without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. An interrupted-tone oscillator, comprising in combination:

(a) first and second unijunction transistor relaxation oscillators, each of said oscillators including a unijunction transistor having an emitter electrode and a timing capacitor connected between its emitter electrode and a point of fixed reference potential, said first oscillator having a higher output pulse repetition rate than said second oscillator, (b) and a unidirectionally conducting diode having its anode connected to the emitter electrode of said first oscillator and its cathode connected to the emitter electrode of said second oscillator.

2. An interrupted-tone oscillator, comprising in combination:

(a) first and second unijunction transistor relaxation oscillators, each of said oscillators comprising:

(1) a unijunction transistor having an emitter electrode, first and second base electrodes, and a current path between said first and said second base electrodes, (2) a timing capacitor connecting said emitter electrode to a point of reference potential, (3) a timing resistor connecting said emitter electrode to a positive power supply terminal, (4) and load means connected in series with said current path between said positive terminal and said point of reference potential, (b) said timing capacitors and said timing resistors being selected so that said first oscillator has a higher repetition rate than said second oscillator, (c) and a diode having its anode connected to said emitter electrode of said first oscillator and its cathode connected to said emitter electrode of said second oscillator.

References Cited by the Examiner

UNITED STATES PATENTS 3,210,686 10/1965 Rocca ---------- 333—111 X

OTHER REFERENCES

General Electric, Silicon Controlled Rectifier Manual, 2nd ed., Dec. 29, 1961, pages 51, 42.

ROY LAKE, *Primary Examiner.*

S. H. GRIMM, *Assistant Examiner.*